(12) United States Patent
Zhang et al.

(10) Patent No.: US 10,971,895 B2
(45) Date of Patent: Apr. 6, 2021

(54) SURFACE PLASMON INFRARED NANO PULSE LASER HAVING MULTI-RESONANCE COMPETITION MECHANISM

(71) Applicant: Southeast University, Jiangsu (CN)

(72) Inventors: Tong Zhang, Jiangsu (CN); Feng Shan, Jiangsu (CN); Xiaoyang Zhang, Jiangsu (CN); Xiaoyi Pang, Jiangsu (CN)

(73) Assignee: Southeast University, Jiangsu (CN)

( * ) Notice: Subject to any disclaimer, the term of this patent is extended or adjusted under 35 U.S.C. 154(b) by 0 days.

(21) Appl. No.: 16/975,398

(22) PCT Filed: May 28, 2018

(86) PCT No.: PCT/CN2018/088735
§ 371 (c)(1),
(2) Date: Aug. 25, 2020

(87) PCT Pub. No.: WO2019/165712
PCT Pub. Date: Sep. 6, 2019

(65) Prior Publication Data
US 2020/0395735 A1    Dec. 17, 2020

(30) Foreign Application Priority Data
Mar. 1, 2018  (CN) .......................... 201810171269.4

(51) Int. Cl.
*H01S 5/10* (2021.01)
*H01S 5/042* (2006.01)
(Continued)

(52) U.S. Cl.
CPC .......... *H01S 5/1046* (2013.01); *H01S 3/0627* (2013.01); *H01S 3/1115* (2013.01);
(Continued)

(58) Field of Classification Search
CPC ..................................................... H01S 5/1046
See application file for complete search history.

(56) References Cited

U.S. PATENT DOCUMENTS

| 6,836,494 B1 * | 12/2004 | Stuart | ..................... G02F 1/353 372/39 |
| 9,356,427 B2 * | 5/2016 | Lee | .......................... H01S 3/086 |

(Continued)

FOREIGN PATENT DOCUMENTS

| CN | 101849203 | 9/2010 |
| CN | 102623887 | 8/2012 |

(Continued)

OTHER PUBLICATIONS

"International Search Report (Form PCT/ISA/210) of PCT/CN2018/088735," dated Nov. 28, 2018, pp. 1-4.

*Primary Examiner* — Tod T Van Roy
(74) *Attorney, Agent, or Firm* — JCIP Global Inc.

(57) ABSTRACT

A surface plasmon infrared nano-pulse laser having a multi-resonance competition mechanism, consisting of the four parts of a surface plasmon nano-pin resonance chamber (1), a spacer layer (2), a gain medium (3), and a two-dimensional material layer (4). The surface plasmon nano-pin resonance chamber (1) consists of a metal nano rod (11) and one or more nano sheets (12) grown thereon, the surface plasmon nano-pin resonance chamber (1) and the gain medium (3) being isolated by the isolating layer (2), and the two-dimensional material layer (4) covering a surface of the surface plasmon nano-pulse laser; positive and negative electrodes (5) are located at two ends of the surface plasmon nano-pulse laser, and a layer of a two-dimensional material having a feature of saturatable absorption is introduced to a surface of the nano-pin resonance chamber.

9 Claims, 5 Drawing Sheets

(51) Int. Cl.
*H01S 3/06* (2006.01)
*H01S 3/11* (2006.01)
*H01S 3/16* (2006.01)
*H01S 5/34* (2006.01)
*G02B 5/00* (2006.01)

(52) U.S. Cl.
CPC .......... *H01S 3/169* (2013.01); *H01S 5/04252* (2019.08); *H01S 5/04257* (2019.08); *H01S 5/1042* (2013.01); *H01S 5/3412* (2013.01); *G02B 5/008* (2013.01); *G02F 2203/10* (2013.01)

(56) References Cited

U.S. PATENT DOCUMENTS

| | | | |
|---|---|---|---|
| 9,715,159 B1* | 7/2017 | Akselrod | G02F 1/353 |
| 2007/0273959 A1* | 11/2007 | Lawandy | B82Y 20/00 |
| | | | 359/333 |
| 2009/0236539 A1* | 9/2009 | Stockman | B82Y 20/00 |
| | | | 250/395 |
| 2010/0316078 A1* | 12/2010 | Ono | B82Y 20/00 |
| | | | 372/45.01 |
| 2012/0224255 A1* | 9/2012 | Bora | B82Y 40/00 |
| | | | 359/346 |
| 2013/0070799 A1* | 3/2013 | Lee | G02B 6/1226 |
| | | | 372/45.01 |
| 2013/0148682 A1* | 6/2013 | Zhang | B82Y 20/00 |
| | | | 372/45.01 |
| 2014/0054475 A1* | 2/2014 | Khajavikhan | H01S 5/30 |
| | | | 250/552 |
| 2015/0109606 A1 | 4/2015 | Peale et al. | |
| 2017/0242163 A1* | 8/2017 | Aksyuk, IV | G02B 1/002 |

FOREIGN PATENT DOCUMENTS

| | | | |
|---|---|---|---|
| CN | 105406357 | 3/2016 | |
| CN | 107069417 | 8/2017 | |
| FR | 2973593 A1 * | 10/2012 | H01S 5/1046 |

* cited by examiner

SURFACE PLASMON INFRARED NANO PULSE LASER HAVING MULTI-RESONANCE COMPETITION MECHANISM

CROSS-REFERENCE TO RELATED APPLICATION

This application is a 371 of international application of PCT application serial no. PCT/CN2018/088735, filed on May 28, 2018, which claims the priority benefit of China application no. 201810171269.4, filed on Mar. 1, 2018. The entirety of each of the above mentioned patent applications is hereby incorporated by reference herein and made a part of this specification.

BACKGROUND

Technical Field

The present invention relates to the fields of nano optoelectronic devices and nanolasers, and in particular, to a tunable surface plasmon infrared nano pulse laser based on a multi-resonance competition mechanism.

Description of Related Art

In recent years, ultra-small-sized nanolaser devices consisting of nano-structured resonance cavities have important application prospects in the fields such as nano imaging, biomedicine, information storage, and nano robots. Limited by the diffraction limit, a conventional optical laser has disadvantages such as a large size, a high threshold, and a complex preparation process. In some special application occasions, a size of a laser device needs to be nanoscale. For example, in applications to blood detection and on-chip optical interconnection, a feature scale of the laser is directly required to close to that of an electronic device, and power consumption thereof is required to be less than that of mature electrical interconnection and should be on the order of 10 femtojoules per bit. Therefore, a surface plasmonic laser that can break through the diffraction limit differs from the conventional optical laser in that: by amplifying surface plasmons corresponding to the free electron oscillations in metal, rather than photons, a light field limitation on a feature scale with a deep sub-wavelength of 10 nm can be achieved for plasmonic laser. However, loss of a metal material is relatively high, and in a surface plasmonic nanolaser device constructed based on the metal material, a Q value obtained by the device is relatively low, a threshold is relatively high, and performance of the nanolaser is relatively limited. Moreover, for a common nanolaser consisting of a metal nano-resonance cavity structure, performance, such as a pulse and a Q value, of laser emission thereof is non-tunable, a laser emission wavelength control range is also very limited, and there is no directivity. Therefore, there is an urgent need for a low-threshold, tunable, and ultra-small-size nanolaser device.

The present patent provides a surface plasmon infrared nano pulse laser having a multi-resonance competition mechanism. A surface plasmon nano-pin resonance chamber of the surface plasmon infrared nano pulse laser has a multi-resonance mechanism competition effect. Increasing an aspect ratio of a nanorod in the nano-pin resonance chamber can red-shift a resonance peak within a large range, and the resonance peak can be red-shifted even from a visible band to an infrared region. A position of the surface plasmonic resonance peak can be controlled by changing parameters, such as a size, a quantity, a position, and a direction, of the nano sheets in the nano-pin resonance chamber, to make the position match the resonance peak of the nanorod to further form a multi-resonance competition mode, thereby achieving a resonance peak with an ultra-high Q value at a specific wavelength, so that a threshold of the pulse nanolaser can be lowered. When an emission wavelength of the gain medium is consistent with a resonance peak of the nano-pin resonance chamber, laser with the strongest energy is obtained. A nanolaser with wide band emission, particularly, in an infrared band, can be implemented by selecting a gain medium with an emission wavelength matching a resonance peak.

More importantly, a two-dimensional material having a property of saturable absorption is introduced into the surface plasmonic nanolaser provided in the present patent. By utilizing the inherent property of saturable absorption of the two-dimensional material, when incident light is relatively weak, the two-dimensional material layer is completely absorbed, causing that loss of a nano-pin resonance chamber increases, and the laser is in a low Q state; when the incident light becomes strong enough due to an increased inverted population density, the two-dimensional material layer is almost transparent to the incident light, loss of the nano-pin resonance chamber is sharply reduced, the nanolaser is in a high Q state, and stored energy is released in a very short time, thereby outputting high-energy Q-switched pulse laser.

SUMMARY

Technical problem: An objective of the present invention is to overcome a high threshold, a non-tunable pulse and Q value, and a narrow control range of a laser emission wavelength of an existing surface plasmonic nanolaser and provide a tunable surface plasmon infrared nanolaser based on a multi-resonance competition mechanism, where the nanolaser can achieve a low threshold and that an emission wavelength of the nanolaser can be tuned from a visible-infrared band. With regard to a property of saturable absorption, when incident light is relatively weak, a two-dimensional material layer is completely absorbed, causing that loss of a nano-pin resonance chamber increases, and the laser is in a low Q state; when the incident light becomes strong enough due to an increased inverted population density, the two-dimensional material layer is almost transparent to the incident light, loss of the nano-pin resonance chamber is sharply reduced, the nanolaser is in a high Q state, and stored energy is released in a very short time, thereby outputting high-energy Q-switched pulse laser. The present invention has important application prospects in the fields such as nano imaging, biomedicine, information storage, and nano robots.

Technical solution: The present invention provides a surface plasmon infrared nano pulse laser having a multi-resonance competition mechanism, consisting of the four parts of a surface plasmon nano-pin resonance chamber with a multi-resonance mechanism competition effect, a spacer layer, a gain medium, and a two-dimensional material layer, where the surface plasmon nano-poin resonance chamber consists of a metal nanorod and one or more nano sheets grown thereon, the surface plasmon nano-pin resonance chamber and the gain medium being isolated by the spacer layer, and the two-dimensional material layer covering a surface of the surface plasmon nano pulse laser; and positive and negative electrodes are located at two ends of the surface plasmon nano pulse laser.

Wherein:

The surface plasmon nano-pin resonance chamber includes a metal nanorod and one or more nano sheet structures grown thereon, where materials of the metal nanorod and the nano sheets are both metal materials with a surface plasmonic characteristic, and the metal nanorod has a length ranging from 20 nm to 30 microns and a diameter ranging from 10 nm to 200 nm; and the nano sheet structures having a surface plasmon resonance effect is a nanoparticle with one or more anisotropic morphologies.

The metal material with a surface plasmonic characteristic is gold, silver, copper, or aluminum; and a material of the metal nanorod and a material of the nano sheet are the same or different.

A shape of the nanoparticle with the anisotropic morphology is a triangular plate, a tetrahedron, a hexagonal plate, or a decahedron.

The gain medium is a medium material with a gain amplification characteristic.

The medium material with a gain amplification characteristic is a quantum dot, an organic dye, or a rare earth luminescent material.

The spacer layer is an oxide or fluoride inorganic material.

The oxide or fluoride inorganic material is $SiO_2$, $Al_2O_3$, or MgF.

The two-dimensional material layer is a two-dimensional material having a property of saturable absorption.

The material of the electrode is Pd or Ti.

The surface plasmon nano-pin resonance chamber structure may be synthesized by using a chemical method, or may be implemented through various means such as a top-down process.

In a working state of the pulse nanolaser, incident light is vertically irradiated on the nano-pin resonance chamber, surface plasmons are excited by amplifying free electron oscillations in metal on a surface of the nano-pin resonance chamber, and the surface plasmons are continuously amplified by the gain medium on the surface of the nano-pin resonance chamber, to finally generate laser; increasing an aspect ratio of a nanorod in the nano-pin resonance chamber can red-shift a resonance peak within a large range, and the resonance peak can be red-shifted even from a visible band to an infrared region. A position of the surface plasmonic resonance peak can be controlled by changing parameters, such as a size, a quantity, a position, and a direction, of the nano sheets in the nano-pin resonance chamber, to make the position match the resonance peak of the nanorod to further form a multi-resonance competition mode, thereby achieving a resonance peak with an ultra-high Q value at a specific wavelength, so that a threshold of the pulse nanolaser can be lowered. When an emission wavelength of the gain medium is consistent with a resonance peak of the nano-pin resonance chamber, laser with the strongest energy is obtained. A nanolaser with wide band emission, particularly, in an infrared band, can be implemented by selecting a gain medium with an emission wavelength matching a resonance peak.

A method for implementing active Q-switched nanosecond pulse laser: Electronic state density of the two-dimensional material layer is changed by applying a periodically varying voltage to an external circuit on the electrode. When an external voltage is applied, the electronic state density of the two-dimensional material layer gradually increases. When the electronic state density in the two-dimensional material layer reaches saturation, releasing is performed instantaneously, and the Q value of the nano-pin resonance chamber rapidly increases, thereby instantaneously outputting laser pulse. In this case, the level of inverted population in the nano-pin resonance chamber reduces sharply. The foregoing process is repeated to form a sequence of laser pulses.

A method for implementing passive Q-switched nanosecond pulse laser: By utilizing the inherent property of saturable absorption of the two-dimensional material, when incident light is relatively weak, the two-dimensional material layer is completely absorbed, causing that loss of a nano-pin resonance chamber increases, and the laser is in a low Q state; when the incident light becomes strong enough due to an increased inverted population density, the two-dimensional material layer is almost transparent to the incident light, loss of the nano-pin resonance chamber is sharply reduced, the nanolaser is in a high Q state, and stored energy is released in a very short time, thereby outputting high-energy Q-switched pulse laser.

A method for implementing mode-locked ultrafast femto second-attosecond pulse laser: When a laser pulse passes through the two-dimensional material layer, loss of an edge part of the pulse is greater than that of a central part. As a result, the laser pulse is narrowed in a process of passing through the two-dimensional material layer, so that the mode-locked pulse with a stable frequency is self-started and repeated. Based on this method, a width of the laser pulse that can be obtained is on the femto second-attosecond level.

Advantageous effect: Compared with the prior art, the present invention has the following advantages:

1. The surface plasmon infrared nano pulse laser having a multi-resonance competition mechanism according to the present invention resolves the problem that thresholds of the previous reported nanolasers are low. The nano-pin resonance chamber in the plasmonic nanolaser consists of the metal nanorod and the nano sheets grown thereon. The nanorod interacts with incident light to excite a surface plasmonic resonance and perform reflection on two ends of the nanorod to form a Fabry-Perot (F-P) resonance cavity mode; the nano sheets excite a localized surface plasmon resonance (LSPR). Moreover, a resonance spectrum of the nano-pin has both a LSPR characteristic and a F-P cavity resonance characteristic. Therefore, a resonance enhancement effect of the multi-resonance competition mechanism makes the resonance chamber including the nano-pin have a higher Q value. In an optimal resonance state, radiation energy density is higher than that of a single nanorod of the same size and that of a single nano sheet structure of the same size by 3 to 4 orders of magnitude. Compared with the conventional nanoparticle nanolasers, the Q value is improved by two orders of magnitude, making a laser pulse time reach the picosecond level. Currently, most commonly used surface plasmonic resonance cavities reported already are based on nanowires or nanospheres, and are continuous lasers. The present patent provides a new type of laser with a nano-pin structure, to implement picosecond-attosecond pulse laser.

2. The surface plasmon infrared nano pulse laser having a multi-resonance competition mechanism according to the present invention resolves the problem of a large laser emission wavelength control range in the previous reported nanolasers. Increasing an aspect ratio of a nanorod in the nano-pin resonance chamber can red-shift a resonance peak within a large range, and the resonance peak can be red-shifted even from a visible band to an infrared region. A position of the surface plasmonic resonance peak can be controlled by changing parameters, such as a size, a quantity, a position, and a direction, of the nano sheets in the nano-pin resonance chamber, to make the position match the resonance peak of the nanorod to further form a multi-resonance competition mode, thereby achieving a resonance peak with an ultra-high Q value at a specific wavelength, so that a threshold of the pulse nanolaser can be lowered. A nanolaser with wide band emission, particularly, in an infrared band, can be implemented by selecting a gain medium with an emission wavelength matching a resonance peak.

3. The surface plasmon infrared nano pulse laser having a multi-resonance competition mechanism according to the present invention resolves the problem that the pluses and Q values of the previous reported nanolasers are non-tunable. A two-dimensional material having a property of saturable absorption is introduced into the surface plasmonic nanolaser. In an aspect of implementing active Q-switched nanosecond pulse laser: Electronic state density of the two-dimensional material layer is changed by applying a periodically varying voltage to an external circuit on the electrode. When an external voltage is applied, the electronic state density of the two-dimensional material layer gradually increases. When the electronic state density in the two-dimensional material layer reaches saturation, releasing is performed instantaneously, and the Q value of the nano-pin resonance rapidly increases, thereby instantaneously outputting laser pulse. In this case, the level of inverted population in the nano-pin resonance chamber reduces to a threshold. The foregoing process is repeated to form a sequence of laser pulses. In an aspect of implementing passive Q-switched nanosecond pulse laser: By utilizing the inherent property of saturable absorption of the two-dimensional material, when incident light is relatively weak, the two-dimensional material layer is completely absorbed, causing that loss of a nano-pin resonance chamber increases, and the laser is in a low Q state; when the incident light becomes strong enough due to an increased inverted population density, the two-dimensional material layer is almost transparent to the incident light, loss of the nano-pin resonance chamber is sharply reduced, the nanolaser is in a high Q state, and stored energy is released in a very short time, thereby outputting high-energy Q-switched pulse laser.

Figure 1:
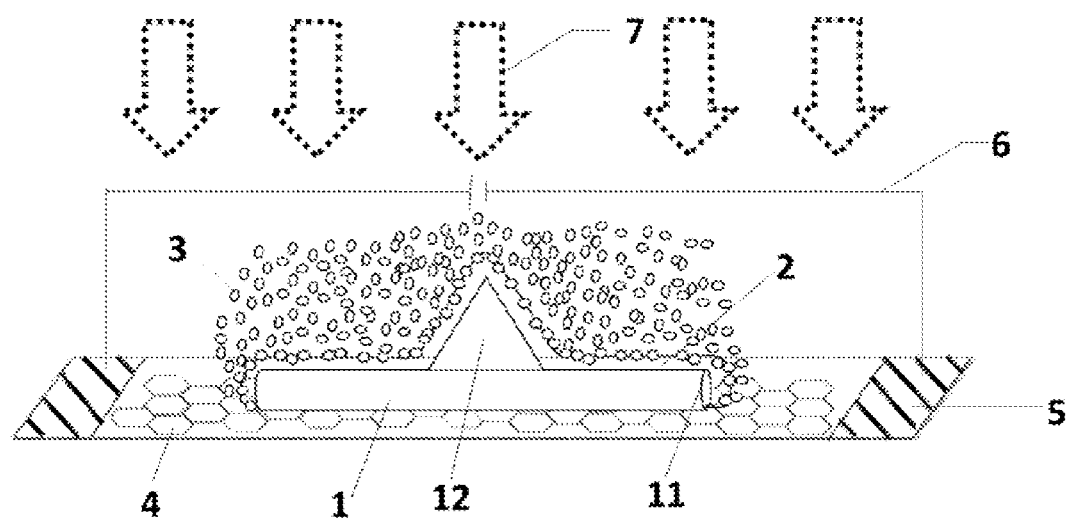
FIG. 1 is a schematic structural diagram of active tuning of a two-dimensional layer of a surface plasmon infrared nano pulse laser having a multi-resonance competition mechanism.

In the figure, there are a surface plasmon nano-pin resonance chamber 1, a spacer layer 2, a gain medium 3, a two-dimensional material layer 4, an electrode 5, a wire 6, and incident light 7.

Figure 2:
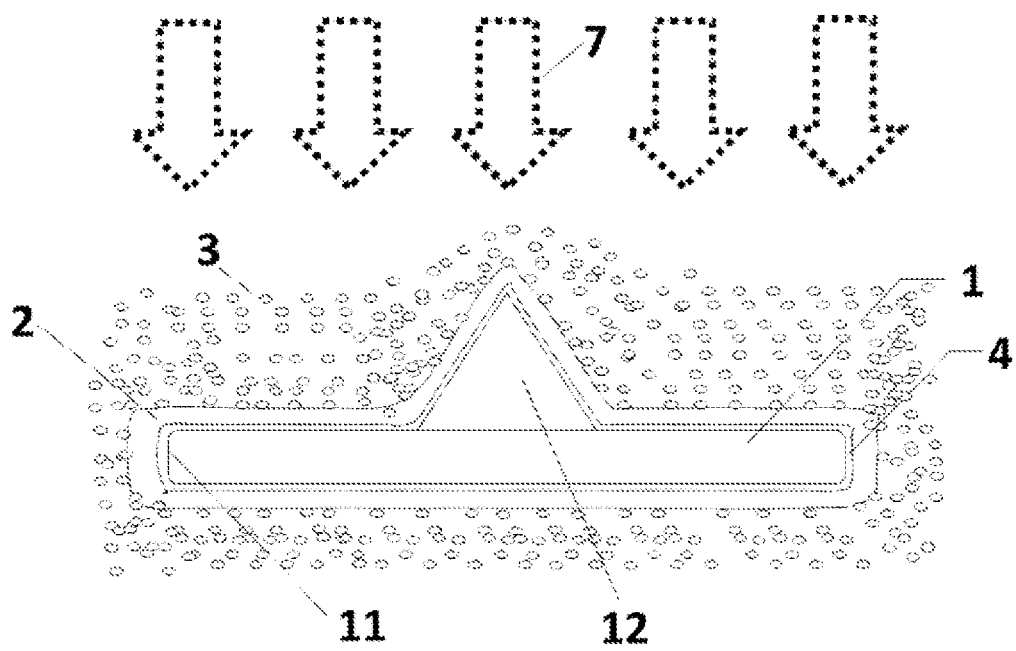

FIG. 2 is a schematic structural diagram of passive tuning of a two-dimensional layer of a surface plasmon infrared nano pulse laser having a multi-resonance competition mechanism.

Figure 3:
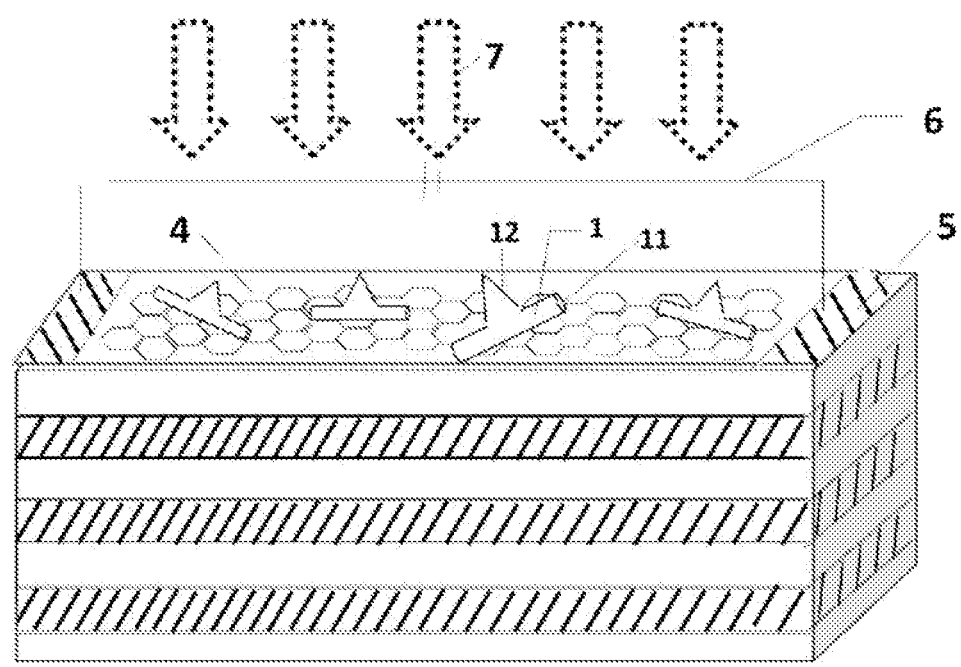

FIG. 3 shows a mixed structure of a surface plasmon infrared nano pulse laser having a multi-resonance competition mechanism and a quantum well.

Figure 4:
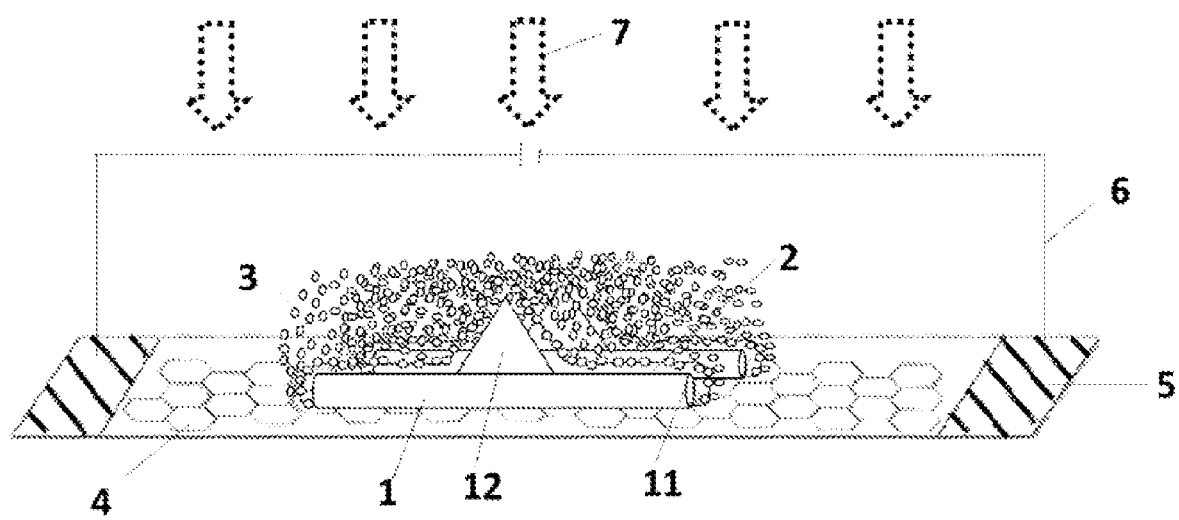

FIG. 4 is a schematic structural diagram of overlapping units of a surface plasmon infrared nano pulse laser having a multi-resonance competition mechanism to form a gap mode.

Figure 5:
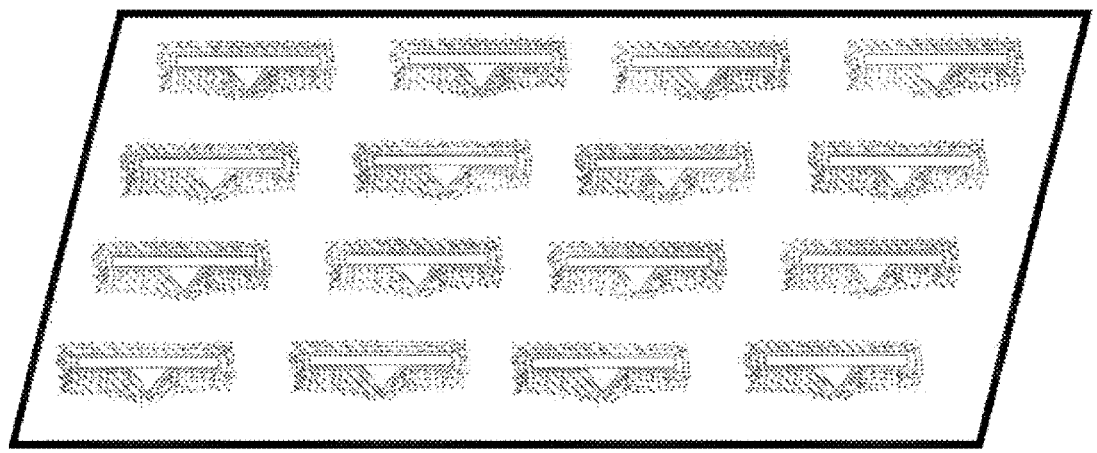

FIG. 5 is a schematic structural diagram of arraying units of a surface plasmon infrared nano pulse laser having a multi-resonance competition mechanism.

Figure 6:
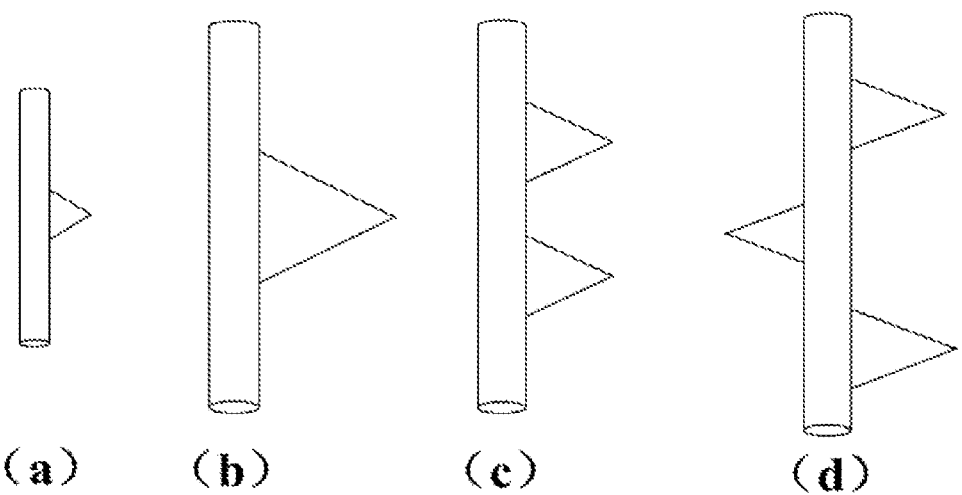

FIG. 6 is a schematic structural diagram of different parameters of a surface plasmon nano-pin resonance chamber having a multi-resonance competition mechanism.

Figure 7:
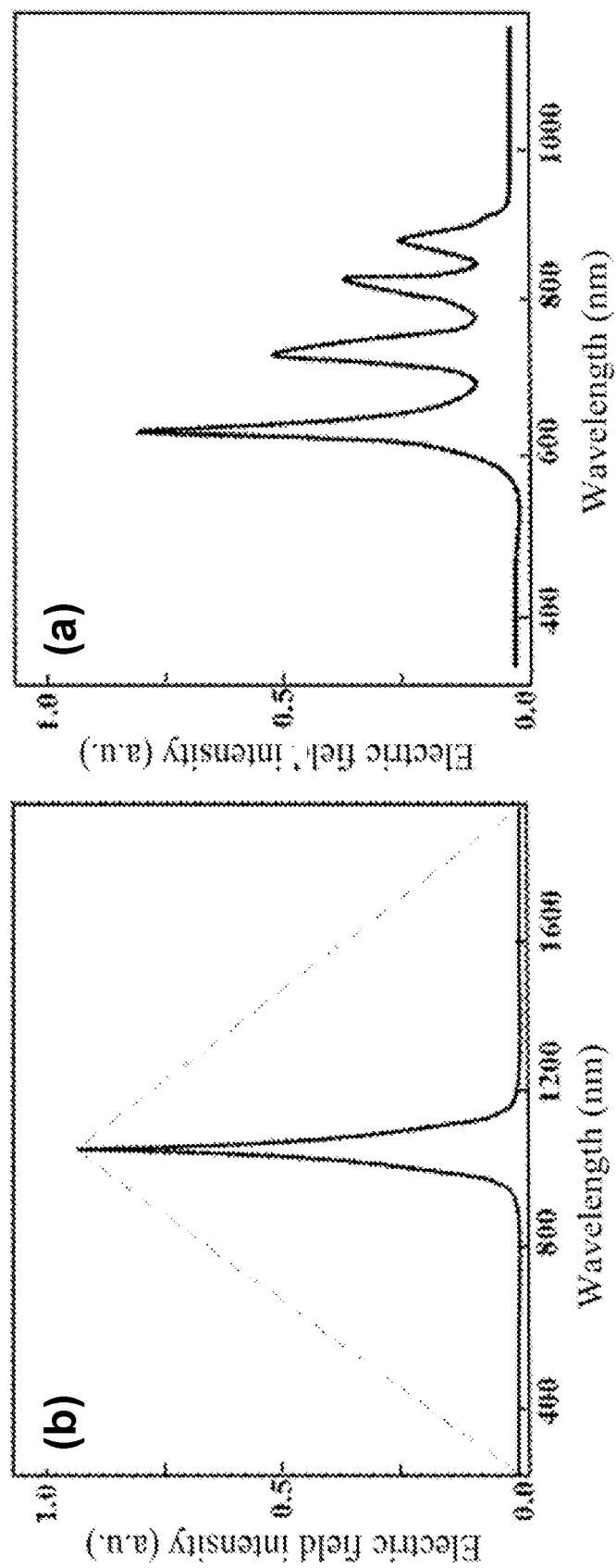

FIG. 7 is a resonance spectrum diagram of a surface plasmon infrared nano pulse laser having a multi-resonance competition mechanism, where the diagram (a) corresponds to a series of resonance peaks excited by a nano-pin resonance chamber, and the diagram (b) corresponds to one resonance peak excited by a nano-pin resonance chamber.

Figure 8:
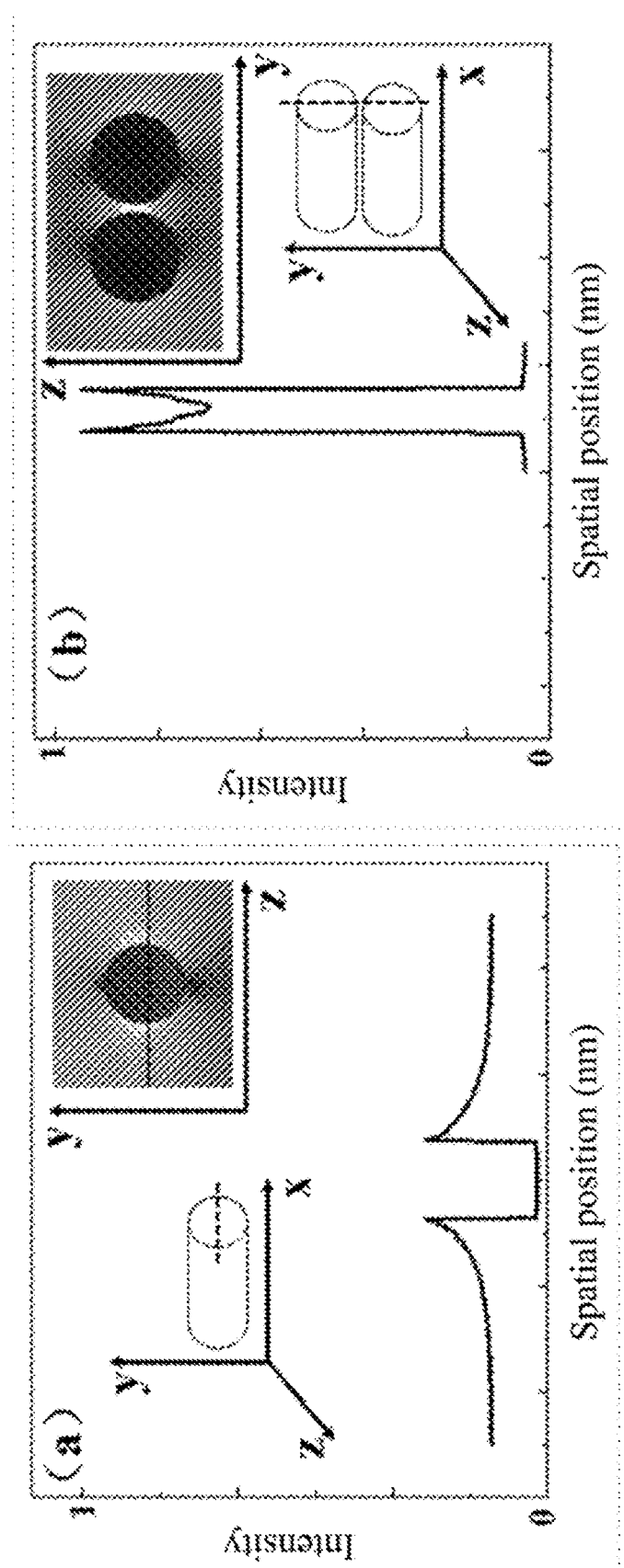

(a) of FIG. 8 is an electromagnetic intensity distribution diagram of a single nanorod along a dashed line on a cross section, and (b) of FIG. 8 is an electromagnetic intensity distribution diagram along a dashed line on a cross section when two nanorods are coupled.

DESCRIPTION OF THE EMBODIMENTS

The present invention is further described below with reference to the accompanying drawing and specific implementations.

According to the present invention, an experimenter can prepare a tunable surface plasmonic infrared nanolaser based on a multi-resonance competition mechanism. Increasing an aspect ratio of a nanorod in the nano-pin resonance chamber can red-shift a resonance peak within a large range, and the resonance peak can be red-shifted even from a visible band to an infrared region. A position of the surface plasmonic resonance peak can be controlled by changing parameters, such as a size, a quantity, a position, and a direction, of the nano sheets in the nano-pin resonance chamber, to make the position match the resonance peak of the nanorod to further form a multi-resonance competition mode, thereby achieving a resonance peak with an ultra-high Q value at a specific wavelength, so that a threshold of the pulse nanolaser can be lowered. When an emission wavelength of the gain medium is consistent with a resonance peak of the nano-pin resonance chamber, laser with the strongest energy is obtained. A nanolaser with wide band emission, particularly, in an infrared band, can be implemented by selecting a gain medium with an emission wavelength matching a resonance peak. Utilizing a characteristic that the resonance peak of the surface plasmon nano-pin resonance chamber can be adjusted in a wide band in a visible-infrared range, an emission wavelength of the nanolaser can be broadened to the infrared region, thereby realizing an infrared nanolaser. In addition, a layer of a two-dimensional material having a property of saturable absorption is introduced to a surface of nano-pin resonance chamber, which may achieve mode locking and Q switching of the surface plasmon infrared nano pulse laser, and increase the laser pulse time of the nanolaser to the femto second-attosecond level.

Wherein:

The surface plasmonic pulse nanolaser includes four parts of a surface plasmon nano-pin resonance chamber 1 with a multi-resonance mechanism competition effect, a spacer layer 2, a gain medium 3, and a two-dimensional material layer 4, where the surface plasmon nano-pin resonance chamber 1 consists of a metal nanorod 11 and one or more nano sheets 12 grown thereon, the surface plasmon nano-pin resonance chamber 1 and the gain medium 3 being isolated by the spacer layer 2, and the two-dimensional material layer 4 covering a surface of the surface plasmonic pulse nanolaser; and positive and negative electrodes 5 are located at two ends of the surface plasmonic pulse nanolaser.

In a working state of the pulse nanolaser, incident light 7 is vertically irradiated on the nano-pin resonance chamber 1, surface plasmons are excited by amplifying free electron oscillations in metal on a surface of the nano-pin resonance chamber, and the surface plasmons are continuously amplified by the gain medium on the surface of the nano-pin resonance chamber, to finally generate laser. Increasing an aspect ratio of a nanorod 11 in the nano-pin resonance chamber 1 can red-shift a resonance peak within a large range, and the resonance peak can be red-shifted even from a visible band to an infrared region. A position of the surface plasmonic resonance peak can be controlled by changing parameters, such as a size, a quantity, a position, and a direction, of the nano sheets 12 in the nano-pin resonance chamber 1, to make the position match the resonance peak of the nanorod 11 to further form a multi-resonance competition mode, thereby achieving a resonance peak with an ultra-high Q value at a specific wavelength, so that a threshold of the pulse nanolaser can be lowered. When an emission wavelength of the gain medium is consistent with a resonance peak of the nano-pin resonance chamber 1, laser with the strongest energy is obtained. A nanolaser with wide band emission, particularly, in an infrared band, can be implemented by selecting a gain medium with an emission wavelength matching a resonance peak.

A method for implementing active Q-switched nanosecond pulse laser: Electronic state density of the two-dimensional material layer 4 is changed by applying a periodically varying voltage to an external circuit 6 on the electrode 5. When an external voltage is applied, the electronic state density of the two-dimensional material layer gradually increases. When the electronic state density in the two-dimensional material layer reaches saturation, releasing is performed instantaneously, and the Q value of the nano-pin resonance chamber 1 rapidly increases, thereby instantaneously outputting laser pulse. In this case, the density of inverted population in the nano-pin resonance chamber 1 reduces sharply. The foregoing process is repeated to form a sequence of laser pulses.

A method for implementing passive Q-switched nanosecond pulse laser: By utilizing the inherent property of saturable absorption of the two-dimensional material, when incident light is relatively weak, the two-dimensional material layer is completely absorbed, causing that loss of a nano-pin resonance chamber 1 increases, and the laser is in a low Q state; when the incident light becomes strong enough due to an increased the density of inverted population, the two-dimensional material layer is almost transparent to the incident light, loss of the nano-pin resonance chamber 1 is sharply reduced, the nanolaser is in a high Q state, and stored energy is released in a very short time, thereby outputting high-energy Q-switched pulse laser.

A method for implementing mode-locked ultrafast femto second-attosecond pulse laser: When a laser pulse passes through the two-dimensional material layer, loss of an edge part of the pulse is greater than that of a central part. As a result, the laser pulse is narrowed in a process of passing through the two-dimensional material layer, so that the mode-locked pulse with a stable frequency is self-started and repeated. Based on this method, a width of the laser pulse that can be obtained is on the femto second-attosecond level.

The surface plasmon nano-pin resonance chamber 1 consists of a metal nanorod and one or more nano sheet structures grown thereon. The material of the metal nanorod may be a metal material with a surface plasmonic characteristic such as gold, silver, copper, or aluminum. The metal nanorod has a length ranging from 20 nm to 30 microns and a diameter ranging from 10 nm to 200 nm. The nano sheet structures with a SPR effect may be a nanoparticle with one or more anisotropic morphologies such as a triangular plate, a tetrahedron, a hexagonal plate, or a decahedron, a material thereof may be a metal material with a surface plasmonic characteristic such as gold, silver, copper, or aluminum, and the material may be the same as or different from that of the nanorod.

In the surface plasmon infrared nano pulse laser having a multi-resonance competition mechanism, the gain medium 3 may be a medium material with a gain amplification characteristic is a quantum dot, an organic dye, or a rare earth luminescent material.

In the surface plasmon infrared nano pulse laser having a multi-resonance competition mechanism, the spacer layer 2 may be an oxide or fluoride inorganic material such as $SiO_2$, $Al_2O_3$, or MgF.

In the surface plasmon infrared nano pulse laser having a multi-resonance competition mechanism, the two-dimensional material layer 4 may be a two-dimensional material having a property of saturable absorption such as graphene.

In the surface plasmon infrared nano pulse laser having a multi-resonance competition mechanism, the electrode 5 may be a material with relatively low resistance such as Pd and Ti.

In the surface plasmon infrared nano pulse laser having a multi-resonance competition mechanism, the surface plasmon nano-pin resonance chamber structure may be synthesized by using a chemical method, or may be achieved through various methods such as a top-down process.

What is claimed is:

1. A surface plasmon infrared nano pulse laser having a multi-resonance competition mechanism, comprising four parts: a surface plasmon nano-pin resonance chamber with a multi-resonance mechanism competition effect, a spacer layer, a gain medium, and a two-dimensional material layer; wherein the surface plasmon nano-pin resonance chamber comprises a metal nano rod and one or more nano sheets grown thereon, the surface plasmon nano-pin resonance chamber and the gain medium being isolated by the spacer layer, the two-dimensional material layer covering a surface of the surface plasmon infrared nano pulse laser; a positive electrode and a negative electrode located at two ends of the surface plasmon infrared nano pulse laser.

2. The surface plasmon infrared nano pulse laser having the multi-resonance competition mechanism according to claim 1, wherein, materials of the metal nano rod and the nano sheets are both metal materials with a surface plasmonic characteristic, the metal nano rod has a length ranging from 20 nm to 30 microns, a diameter ranging from 10 nm to 200 nm; the one or more nano sheets having a surface plasmon resonance (SPR) effect and are comprised of a nanoparticle with one or more anisotropic morphologies.

3. The surface plasmon infrared nano pulse laser having the multi-resonance competition mechanism according to claim 2, wherein the metal materials with the surface plasmonic characteristic is: gold, silver, copper, or aluminum; a material of the metal nano rod and a material of the nano sheets are the same or different.

4. The surface plasmon infrared nano pulse laser having the multi-resonance competition mechanism according to claim 2, wherein a shape of the nanoparticle with the anisotropic morphology is a triangular plate, a tetrahedron, a hexagonal plate, or a decahedron.

5. The surface plasmon infrared nano pulse laser having the multi-resonance competition mechanism according to claim 1, wherein the gain medium is a medium material with a gain amplification characteristic; and wherein the medium material with the gain amplification characteristic is a quantum dot, an organic dye, or a rare earth luminescent material.

6. The surface plasmon infrared nano pulse laser having the multi-resonance competition mechanism according to claim 1, wherein the spacer layer is an oxide or a fluoride inorganic material.

7. The surface plasmon infrared nano pulse laser having the multi-resonance competition mechanism according to claim 6, wherein the oxide or the fluoride inorganic material is $SiO_2$, $Al_2O_3$, or MgF.

8. The surface plasmon infrared nano pulse laser having the multi-resonance competition mechanism according to claim 1, wherein the two-dimensional material layer is a two-dimensional material having a property of saturable absorption.

9. The surface plasmon infrared nano pulse laser having the multi-resonance competition mechanism according to claim 1, wherein a material of the positive electrode and the negative electrode is Pd or Ti.

* * * * *